(12) United States Patent
Kim

(10) Patent No.: US 7,557,630 B2
(45) Date of Patent: Jul. 7, 2009

(54) SENSE AMPLIFIER-BASED FLIP-FLOP FOR REDUCING OUTPUT DELAY TIME AND METHOD THEREOF

(75) Inventor: Young-Sik Kim, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 69 days.

(21) Appl. No.: 11/703,722

(22) Filed: Feb. 8, 2007

(65) Prior Publication Data

US 2008/0030238 A1 Feb. 7, 2008

(30) Foreign Application Priority Data

Aug. 2, 2006 (KR) ........................ 10-2006-0072906

(51) Int. Cl.
*H03K 3/356* (2006.01)
(52) U.S. Cl. .................... 327/210; 327/211; 327/212
(58) Field of Classification Search ................ 327/210, 327/211, 212
See application file for complete search history.

(56) References Cited

U.S. PATENT DOCUMENTS 5,748,020 A * 5/1998 Mactaggart et al. ......... 327/218
6,188,260 B1 2/2001 Stotz et al.
6,507,224 B1 * 1/2003 Lee et al. ..................... 327/91
6,747,485 B1 6/2004 Suryanarayana et al.

* cited by examiner

*Primary Examiner*—Kenneth B. Wells
(74) *Attorney, Agent, or Firm*—Harness, Dickey & Pierce

(57) ABSTRACT

A sense amplifier based flip flop and method thereof are provided. The example sense amplifier-based flip-flop may include a first current passing unit receiving a first clock signal with a first delay, the first current passing unit configured to pass current from a first node to a ground terminal if the applied first clock signal is set to a first logic level and not to pass current from the first node to the ground terminal if the applied first clock signal is set to a second logic level and a second current passing unit receiving a second clock signal with a second delay, the second delay and the first delay not being the same, the second current passing unit configured to pass current from a second node to the ground terminal if the applied second clock signal is set to the first logic level and not to pass current from the second node to the ground terminal if the applied second clock signal is set to the second logic level.

17 Claims, 7 Drawing Sheets

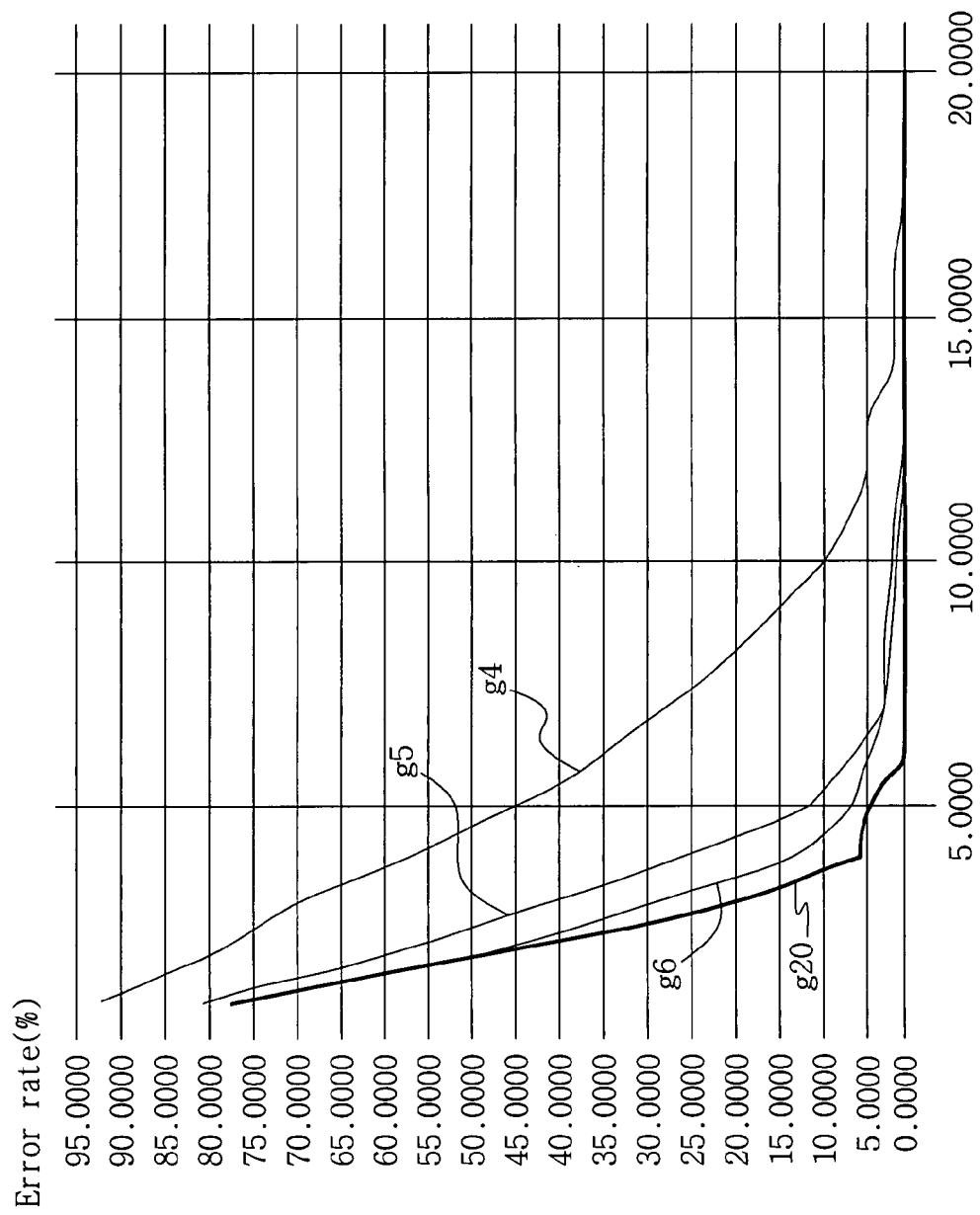

US 7,557,630 B2

SENSE AMPLIFIER-BASED FLIP-FLOP FOR REDUCING OUTPUT DELAY TIME AND METHOD THEREOF

This U.S. nonprovisional patent application claims priority under 35 U.S.C. §119 of Korean Patent Application 10-2006-0072906 filed on Aug. 2, 2006, the entire contents of which are hereby incorporated by reference.

BACKGROUND OF THE INVENTION

1. Field of the Invention

Example embodiments of the present invention relate generally to a sense amplifier-based flip flop and method thereof, and more particularly to a sense amplifier-based flip flop and method of reducing an output delay time.

2. Description of the Related Art

Mobile devices, such as cellular phones, Personal Digital Assistants (PDAs), notebook computers, etc., may include power management systems because conventional mobile devices may include higher storage capacities as well as higher clock speeds and may be embodied using very large scale integration (VLSI). Such power management systems may seek to reduce power consumption of the mobile devices without significantly affecting performance.

The circuit structure of a conventional VLSI system may be divided into two functions. A first function may be a "logic function" to output a given signal in response to an input signal, and a second function may be a "memory function" to store an input signal in response to a clock signal or, alternatively, to output a stored signal. A circuit configured to execute a memory function may typically include one or more flip-flops.

An example of a conventional flip-flop may be a sense amplifier-based flip-flop. The sense amplifier-based flip-flop may typically include a master latch and a slave latch. A current sensing type sense amplifier circuit may be used as the master latch, and a setup time of that master latch may be relatively short. A NAND type RS latch may be used as the slave latch, in which a relatively stable operation may be maintained at higher clock speeds.

FIG. 1 is a circuit diagram illustrating a conventional sense amplifier-based flip-flop.

Referring to FIG. 1, the sense amplifier-based flip-flop may include a first latch 10, a second latch 20 and a current passing unit 30, 32. The first latch 10 may include PMOS transistors PM1, PM2, PM3 and PM4, and NMOS transistors NM1, NM2, NM3, NM4 and NM5. The second latch 20 may be a general NAND type RS latch. Hereinafter, an RS latch may be alternatively referred to as an SR latch.

Referring to FIG. 1, in the first latch 10, PMOS transistor PM1 may be connected between a power terminal VDD and an output node N1, and may operate in response to a clock signal CLK. The output node N1 and an output node N2 may be an output terminal of the first latch 10 and may further function as an input terminal of the second latch 20.

Referring to FIG. 1, PMOS transistor PM2 and NMOS transistors NM1 and NM3 may be disposed between power terminal VDD and a drain terminal N5 of an NMOS transistor NM5. The NMOS transistor NM5 may operate in response to clock signal CLK. Gate terminals of the PMOS transistor PM2 and the NMOS transistor NM1 may be connected in common to output node N2, and an input signal D may be applied to a gate terminal of the NMOS transistor NM3. The PMOS transistor PM3 may be disposed between power terminal VDD and output node N2, and may operate in response to clock signal CLK. PMOS transistor PM4 and NMOS transistors NM2 and NM4 may be connected between power terminal VDD and a drain terminal N5 of NMOS transistor NM5. Gate terminals of the PMOS transistor PM4 and the NMOS transistor NM2 may be connected in common to output node N1, and input signal /D may be applied to a gate terminal of the NMOS transistor NM4.

Referring to FIG. 1, the current passing unit 30, 32 may include a plurality of NMOS transistors NM11, NM12, NM13, NM14, NM15, NM16. A first current passing unit 30 may include a plurality of NMOS transistors NM11, NM12 and NM13, and a second current passing unit 32 may include a plurality of NMOS transistors NM14, NM15 and NM16. The first current passing unit 30 may provide a path in which current of a node N3 may flow to a ground terminal if the clock signal is set to a first logic level (e.g., a higher logic level or logic "1"), and may alternatively cut off the current path if the clock signal is set to a second logic level (e.g., a lower logic level or logic "0"). Likewise, the second current passing unit 32 may provide a path in which current of a node N4 may flow to a ground terminal if the clock signal is set to the first logic level, and may cut off the current path if the clock signal is set to the second logic level.

Referring to FIG. 1, the conventional sense amplifier-based flip-flop including the first latch 10 and the second latch 20 connected to the first latch 10 may be referred to as a sense amplifier D flip-flop because the sense amplifier-based flip-flop may operate as a D flip-flop that may have an applied input signal D, /D and may output an output signal Q, /Q delayed in response to clock signal CLK.

Conventional operation of the sense amplifier-based flip-flop circuit of FIG. 1 will now be described.

In conventional operation of the sense amplifier-based flip-flop circuit of FIG. 1, if clock signal CLK transitions to the second logic level (e.g., a lower logic level or logic "0"), output node N1, N2 may be set to the first logic level (e.g., a higher logic level or logic "1") irrespective of input signal D. In other words, if the clock signal CLK is set to the second logic level, the output node N1 may be set to the first logic level by a turn-on operation of PMOS transistor PM1, and the output node N2 may be set to the first logic level by a turn-on of PMOS transistor PM3. Input signals R and S may be set to the first logic level, and output signals Q and /Q of the second latch 20 may maintain their respective values (e.g., in a pre-charge state of the sense amplifier-based flip-flop of FIG. 1).

In conventional operation of the sense amplifier-based flip-flop circuit of FIG. 1, if the clock signal CLK transitions to the first logic level (e.g., a higher logic level or logic "1"), a voltage level at output nodes N1 and N2 may be affected by a state of input signal D, /D. In an example, the input signal D, /D may refer to a signal including opposite logic levels (e.g., D set to the first logic level and /D set to the second logic level, or vice versa). Alternatively, the input signal D, /D may be set to the same logic level. For example, if the clock signal CLK is set to the first logic level (e.g., a higher logic level or logic "1") and the input signal D has a voltage or logic level higher than the input signal /D, NMOS transistor NM3 may be turned on to a greater degree than an NMOS transistor NM4. A main current path herein may be current passing unit 30, 32. However, if the NMOS transistor NM3 is turned on to a higher degree than the NMOS transistor NM4, current flowing from node N3 to ground terminal through node N5 may be greater than current flowing from node N4 to the ground terminal through the node N5. Thus, a voltage level of the node N3 may be lower than a voltage level of the node N4. Further a voltage level difference between output node N1 and output node N2 may be sufficient to detect a logic level difference (e.g., between the first and second logic levels).

Signals of the output nodes N1 and N2 may thereby be provided as input signals R and S of the second latch 20.

In conventional operation of the sense amplifier-based flip-flop circuit of FIG. 1, if the clock signal CLK transitions to the first logic level (e.g., a higher logic level or logic "1") and the input signal D has a voltage level lower than that of the input signal /D, an opposite result as above-described may occur. In other words, the output node N1 may be set to a higher voltage level and the output node N2 may be set to a lower voltage level. In an example, if the current passing unit 30, 32 is not included within the sense amplifier-based flip-flop of FIG. 1, a duration for current to propagate from the nodes N3 and the node N4 to the ground terminal may be lengthened if the clock signal CLK is set to the first logic level (e.g., a higher logic level or logic "1"). Accordingly, the current passing unit 30, 32 may reduce the duration of current propagation, thereby reducing an output delay time, which may be called a CLK to Q delay, from a transition of clock signal CLK to a final output Q, /Q. Thereby, the current passing unit 30, 32 may improve a performance of the sense amplifier-based flip-flop.

For example, output nodes N1 and N2 may be precharged if the clock signal CLK is set to the second logic level (e.g., a lower logic level or logic "0"). Alternatively, if the clock signal CLK is set to the first logic level (e.g., a higher logic level or logic "1"), voltage levels of the output nodes N1 and N2 may be based upon a voltage level difference between input signal D and input signal /D. A time period provided when the clock signal CLK is set to the first logic level (e.g., a higher logic level or logic "1") may be referred to as an "evaluation period". The first latch 10 may have an evaluation state within the evaluation period. Signals output from the output nodes N1 and N2 during the evaluation period may be referred to as evaluation signals.

FIG. 2 illustrates signal levels during an operation of the conventional sense amplifier-based flip-flop of FIG. 1. In particularly, in FIG. 2, signal levels of clock signal CLK, input signal D, /D and output node N1, N2, N3, N4 are illustrated.

Referring to FIG. 2, if the clock signal CLK is set to the second logic level (e.g., a lower logic level or logic "0"), each of the output nodes N1, N2, N3 and N4 may be maintained at the first logic level (e.g., a higher logic level or logic "1"). If the clock signal CLK transitions to the first logic level, the level of the output nodes N1, N2, N3, N4 may be changed in response to the transition.

Referring to FIG. 2, as a review of the respective voltages at nodes N1, N2 and nodes N3, N4 will reveal, the wave of node N1, N2 may experience a given delay period as compared to the nodes N3, N4.

Referring to FIG. 2, a period from the transition of the clock signal CLK to an applied time of output signal Q, Q' of the second latch 20 may be illustrated, and delay time t1 may be indicative of a period from the transition time of the clock signal CLK to an output time of output node N1, N2 of the first latch 10. The latch operation of the second latch 20, while not specifically illustrated, may be the same as described above. The delay time t1 may be an output delay time from a transition of the clock signal CLK to a final output Q, Q'.

As described above, the conventional sense amplifier-based flip-flop may reduce an output delay time from a transition time of a clock signal to a final output signal via a current passing unit. However, the use of the current passing unit may decrease an input sensitivity of the conventional sense amplifier-based flip-flop. Thus, if a voltage level difference of input signals is relatively small, the sense amplifier-based flip-flop may not detect the voltage difference, thereby increasing the likelihood of data loss and/or operation error.

SUMMARY OF THE INVENTION

An example embodiment of the present invention is directed to a sense amplifier-based flip-flop, including a first current passing unit receiving a first clock signal with a first delay, the first current passing unit configured to pass current from a first node to a ground terminal if the applied first clock signal is set to a first logic level and not to pass current from the first node to the ground terminal if the applied first clock signal is set to a second logic level and a second current passing unit receiving a second clock signal with a second delay, the second delay and the first delay not being the same, the second current passing unit configured to pass current from a second node to the ground terminal if the applied second clock signal is set to the first logic level and not to pass current from the second node to the ground terminal if the applied second clock signal is set to the second logic level.

Another example embodiment of the present invention is directed to a method of reducing an output delay time in a sense amplifier-based flip-flop, including applying a first clock signal with a first delay to a first current passing unit, the first current passing unit configured to pass current from a first node to a ground terminal if the applied first clock signal is set to a first logic level and not to pass current from the first node to the ground terminal if the applied first clock signal is set to a second logic level and applying a second clock signal with a second delay to a second current passing unit, the second delay and the first delay not being the same, the second current passing unit configured to pass current from a second node to the ground terminal if the applied second clock signal is set to the first logic level and not to pass current from the second node to the ground terminal if the applied second clock signal is set to the second logic level.

Another example embodiment of the present invention is directed to a sense amplifier circuit and a sense amplifier-based flip-flop having the same, which are capable of increasing input sensitivity and/or reducing a data loss or operation error.

Another example embodiment of the present invention is directed to a sense amplifier circuit, a sense amplifier-based flip-flop having the same, for reducing output delay time.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 8 is a graph illustrating error rates based on input signal levels according to another example embodiment of the present invention.

DETAILED DESCRIPTION OF EXAMPLE EMBODIMENTS OF THE PRESENT INVENTION

Figure 1:
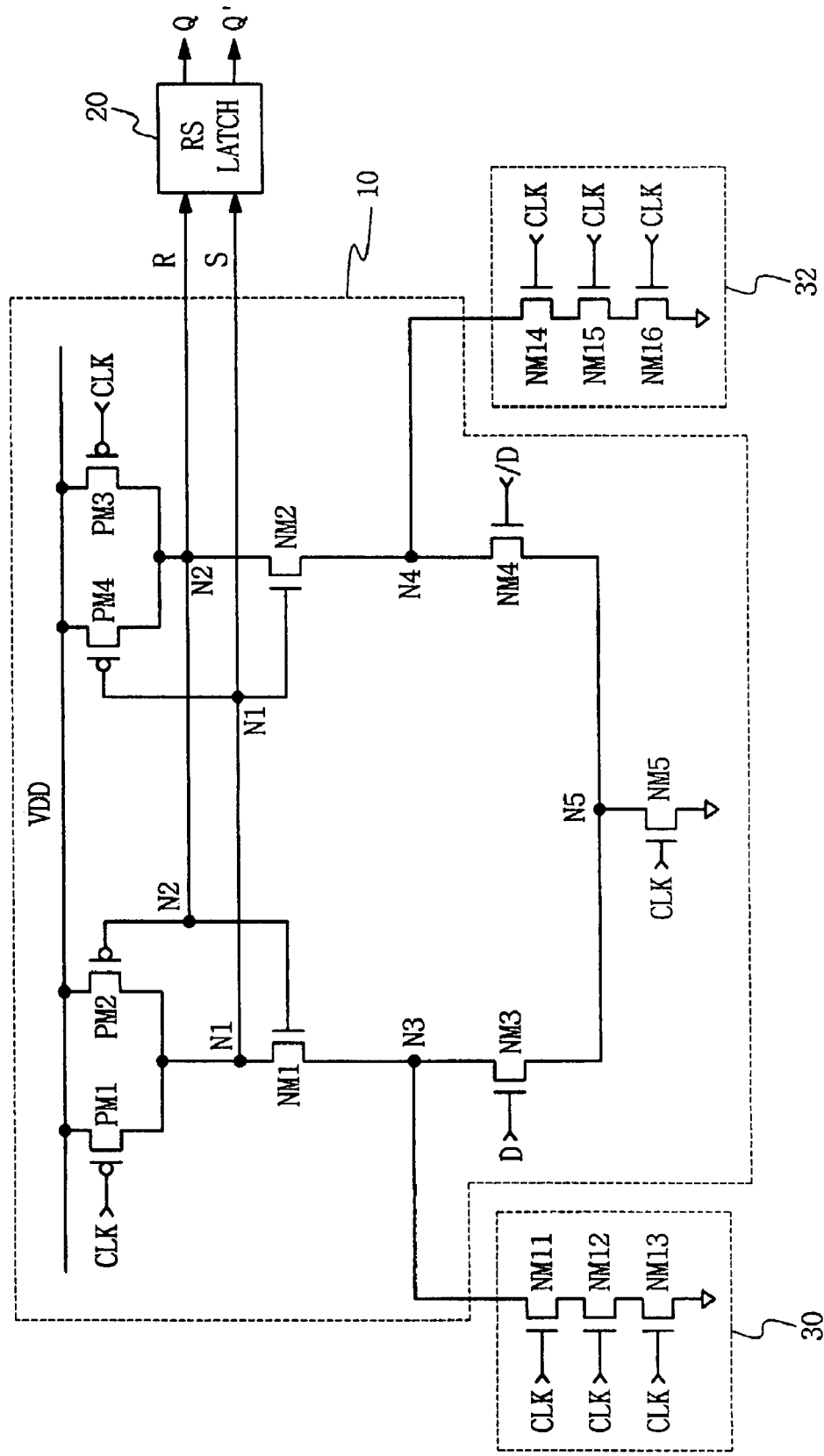
FIG. 1 is a circuit diagram illustrating a conventional sense amplifier-based flip-flop.
Figure 2:
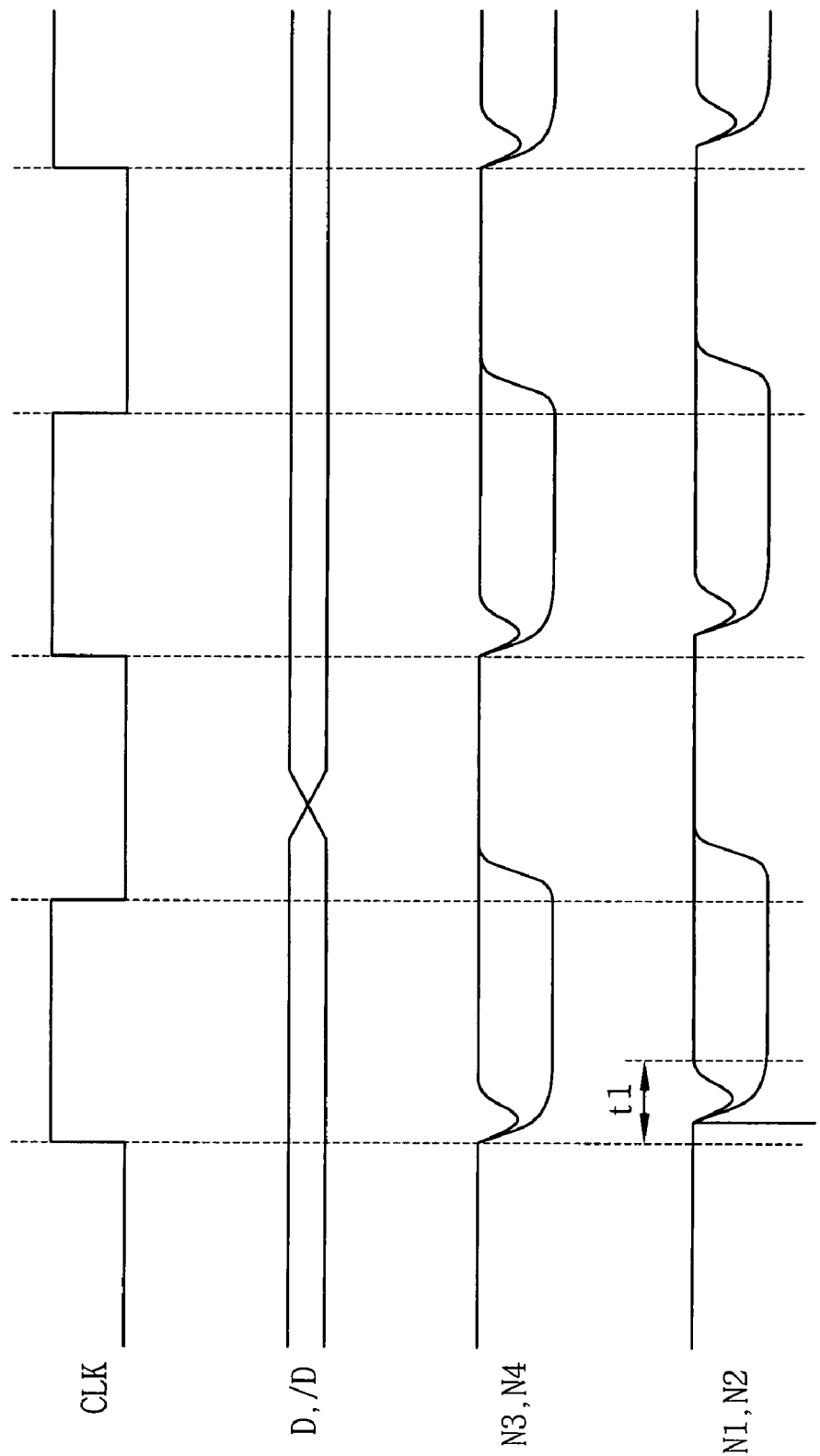
FIG. 2 illustrates signal levels during an operation of the conventional sense amplifier-based flip-flop of FIG. 1.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
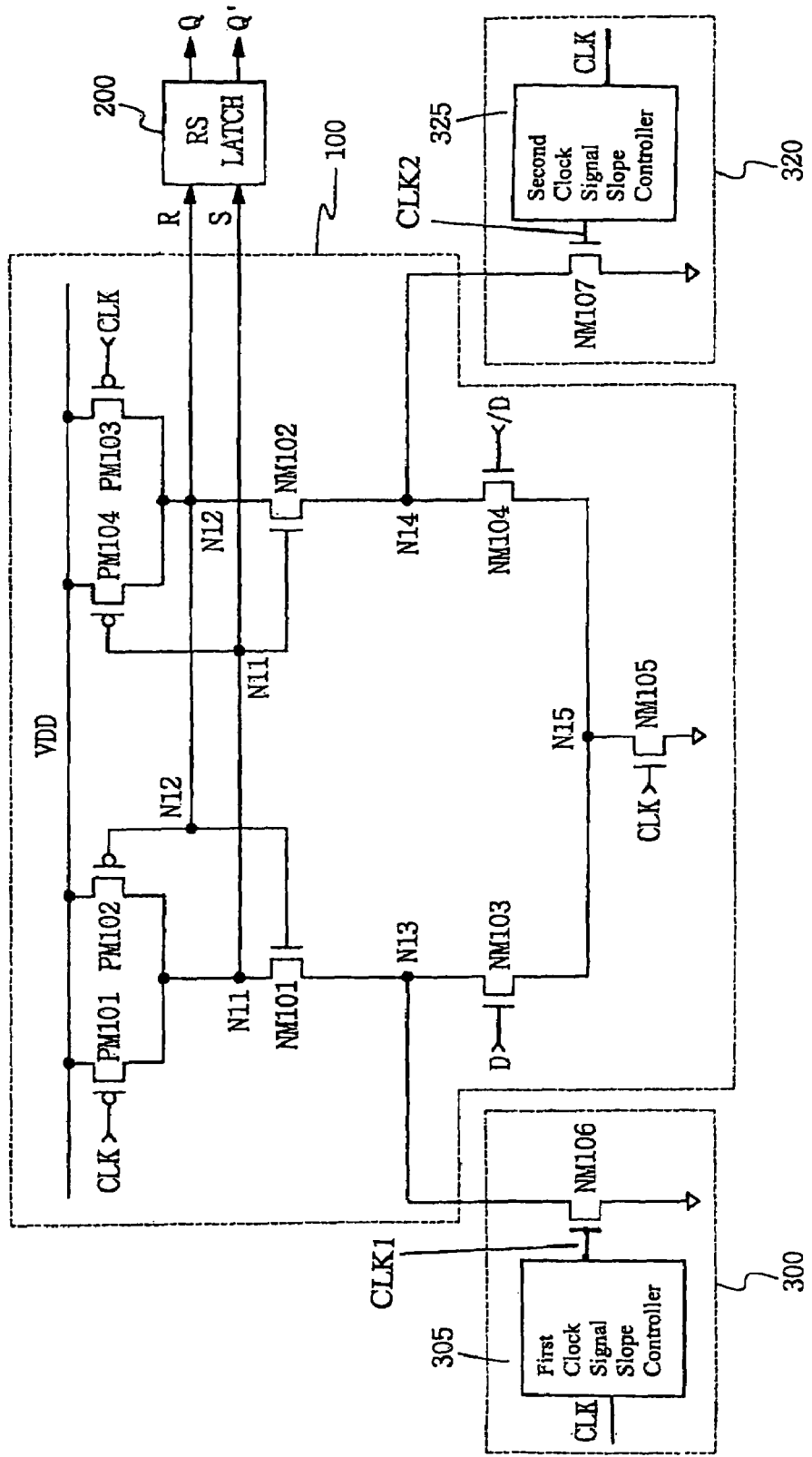
FIG. 3 is a circuit diagram of a sense amplifier-based flip-flop according to an example embodiment of the present invention.

FIG. 3 is a circuit diagram of a sense amplifier-based flip-flop according to an example embodiment of the present invention.

In the example embodiment of FIG. 3, the sense amplifier-based flip-flop may operate in response to a clock signal CLK and may include a first latch 100, a second latch 200, a first current passing unit 300, a second current passing unit 320, a first clock signal slope controller 305 and a second clock signal slope controller 325.

In the example embodiment of FIG. 3, the first latch 100 may include a first PMOS transistor PM101 disposed between a power terminal and the first node N11, which may be turned on or off in response to the clock signal CLK, a second PMOS transistor PM102 disposed between the power terminal VDD and the first node N11, a gate terminal of the second PMOS transistor PM102 being connected to the second node N12, and a first NMOS transistor NM101 disposed between the first node N11 and a third node N13, a gate terminal of the first NMOS transistor NM101 being connected to the second node N12.

In the example embodiment of FIG. 3, the first latch 100 may further include a third PMOS transistor PM103 disposed between the power terminal VDD and the second node N12, which may be turned on or off in response to the clock signal CLK, a fourth PMOS transistor PM104 disposed between the power terminal VDD and the second node N12, a gate terminal of the fourth PMOS transistor PM104 being connected to the first node N11, and a second NMOS transistor NM102 disposed between the second node N12 and a fourth node N14, a gate terminal of the second NMOS transistor NM102 being connected to the first node N11.

In the example embodiment of FIG. 3, the first latch 100 may further include a third NMOS transistor NM103 disposed between the third node N13 and a fifth node N15, which may be controlled by a first input signal D as one of the input signal pair D, /D, and a fourth NMOS transistor NM104 disposed between the fourth node N14 and the fifth node N15, which may be controlled by a second input signal /D as another of the input signal pair D, /D.

In the example embodiment of FIG. 3, the third node N13 and the fourth node N14 may constitute a current passing node pair of the first latch 100.

In the example embodiment of FIG. 3, the first latch 100 may further include a fifth NMOS transistor NM105 disposed between the fifth node N51 and a ground terminal, which may be turned on or off in response to the clock signal CLK.

In the example embodiment of FIG. 3, the first latch 100 may output a signal set to the first logic level (e.g., a higher logic level or logic "1") to a first output terminal N11, N12 if the clock signal CLK is set to the second logic level (e.g., a lower logic level or logic "0"), and may output an evaluation signal pair corresponding to an input signal pair D, /D to the first output terminal N11, N12 if the clock signal CLK is set to the first logic level. The first output terminal N11, N12 may be an output terminal of the first latch 100, and may be connected to an input terminal R, S of the second latch 200. Thus, the first output terminal N11, N12 may be an output terminal of the first latch 100 and may concurrently function as an input terminal of the second latch 200. The second latch 200 may latch the evaluation signal pair output from the first output terminal N11, N12, and may output the latched evaluation signal pair to a second output terminal Q, Q'.

In the example embodiment of FIG. 3, the first output terminal N11, N12 may include a first node N11 and a second node N12. The first node N11 may be set to the first logic level (e.g., a higher logic level or logic "1") if the clock signal CLK is set to the second logic level (e.g., a lower logic level or logic "0"). Alternatively, the first node N11 may be set to a first evaluation signal as one of an evaluation signal pair corresponding to the input signal pair D, /D if the clock signal is set to the first logic level (e.g., a higher logic level or logic "1").

In the example embodiment of FIG. 3, the second node N12 may be set to the first logic level (e.g., a higher logic level or logic "1") if the clock signal CLK is set to the second logic level (e.g., a lower logic level or logic "0"). Alternatively, the second node N12 may be set to a second evaluation signal as another of the evaluation signal pair corresponding to the input signal pair D, /D if the clock signal is set to the first logic level.

In the example embodiment of FIG. 3, the second latch 200 may receive an evaluation signal pair output from the first output terminal N11, N12, which may include the first node N11 and the second node N12, through an input terminal R, S, and may latch the received evaluation signal pair. The second latch 200 may output the latched evaluation signal pair to second output terminal Q, Q' as a final output terminal. The second latch 200 may be referred to as an RS latch, an SR latch, RS flip-flop, etc., and an operation thereof will now be described in greater detail.

In example operation of the second latch 200 of FIG. 3, if logic levels of the evaluation signal pair output from the first output terminal N11, N12 are set to different logic levels, the second latch 200 may output an output signal corresponding to the evaluation signal pair output from the first output terminal N11, N12, to second output terminal Q, Q'. In an alternative example, if the logic levels of the output signal R, S are each set to the second logic level (e.g., a lower logic level or logic "0"), the second latch 200 may output an undefined value. In another alternative example, if the logic levels of the output signal R, S each set to the first logic level (e.g., a higher logic level or logic "1"), the second latch 200 may output a precharge state.

In the example embodiment of FIG. 3, the first and second current passing units 300 and 320 may be connected between a current passing node pair N13, N14 of the first latch 100 and a ground terminal, and may be turned on if the clock signal CLK transitions from the second logic level (e.g., a lower logic level or logic "0") to the first logic level (e.g., a higher logic level or logic "1"), thereby passing current of the current passing node pair N13, N14 of the first latch 100 to the ground terminal.

In the example embodiment of FIG. 3, the first current passing unit 300 may be coupled between a third node N13 as one of the current passing node pair, and a ground terminal, and may include a sixth NMOS transistor NM106 controlled by an output signal CLK1 of the first clock signal slope controller 305.

In the example embodiment of FIG. 3, the second current passing unit 300 may be coupled between a fourth node N14 as another of the current passing node pair, and the ground terminal, and may include a seventh NMOS transistor NM107 controlled by an output signal CLK2 of the second clock signal slope controller 325.

In the example embodiment of FIG. 3, through the use of the first current passing unit 300 and the second current passing unit 320, if the clock signal transitions to the first logic level (e.g., a higher logic level or logic "1"), current may flow from the current passing node pair N13, N14 to the ground terminal, and a rate at which voltage of the current passing node pair N13, N14 decreases may be relatively high, thereby improving a sensing operation of the first latch 100. Accordingly, the sense amplifier-based flip-flop may include the first and second current passing units 300 and 320 so as to reduce an output delay time from a time at which the clock signal CLK transitions from the second logic level (e.g., a lower logic level or logic "0") to the first logic level (e.g., a higher logic level or logic "1"), to an output time of evaluation signal pair from second output terminal Q, /Q.

In the example embodiment of FIG. 3, the first clock signal slope controller 305 may generate an output signal CLK1 which may be applied to a gate terminal of sixth NMOS transistor NM106 of the first current passing unit 300, after receiving the clock signal CLK. The second clock signal slope controller 325 may generate an output signal CLK2 which may be applied to a gate terminal of seventh NMOS transistor NM107 of the second current passing unit 320, after receiving the clock signal CLK.

In the example embodiment of FIG. 3, an amount of delay of the output signal CLK1 and the output signal CLK2 may be different. In other words, if the clock signal CLK transitions from the first logic level (e.g., a higher logic level or logic "1") to the second logic level (e.g., a lower logic level or logic "0"), points of time when the output signals CLK1 and CLK2 are generated following the clock signal CLK transitioning to the first logic level (e.g., a higher logic level or logic "1") may be different from each other. For example, if a first input signal D is set to the first logic level (e.g., a higher logic level or logic "1") and a second input signal /D is set to the second logic level (e.g., a lower logic level or logic "0") and the output signal CLK1 transitions to the first logic level more quickly than the output signal CLK2, a current of third node N13 may be driven to the ground terminal more quickly than that of the fourth node N14, thereby increasing a speed of a sensing operation of the first latch 100. Thus, an output delay time from a transition time of the clock signal CLK to an output of final output signal Q, /Q may be reduced, thereby improving a performance of the sense amplifier-based flip-flop of FIG. 3.

The first and second clock signal slope controllers 305 and 325 of the example embodiment of FIG. 3 will be described in greater detail below with respect to the example embodiments of FIGS. 5 and 6.

Figure 4:
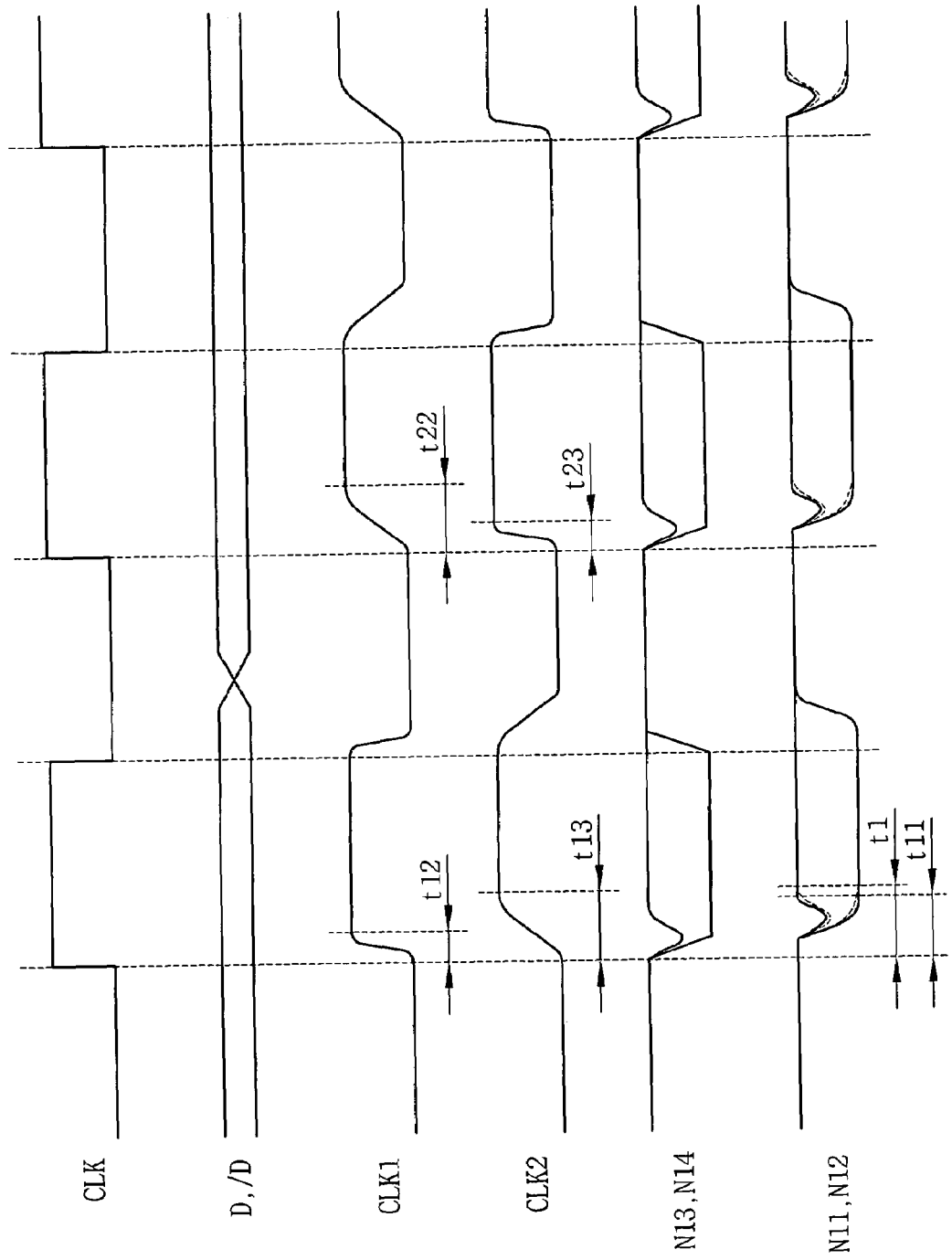
FIG. 4 illustrates a timing diagram of an operation of the sense amplifier-based flip-flop of FIG. 3 according to another example embodiment of the present invention.

FIG. 4 illustrates a timing diagram of an operation of the sense amplifier-based flip-flop of FIG. 3 according to another example embodiment of the present invention. In particular, FIG. 4 illustrates a logic level transition of first through fourth nodes N11~N14 based on a transition of the clock signal CLK.

In the example embodiments of FIGS. 3 and 4, if the input signal pair D, /D is applied and the clock signal CLK is maintained as the second logic level (e.g., a lower logic level or logic "0"), first node N11 and second node N12 may be maintained at the first logic level (e.g., a higher logic level or logic "1") (e.g., irrespective of a logic level of the input signal pair D, /D). Thus, a logic level of the input signal pair D, /D may not affect voltages at the first node N11 and the second node N1. Such a state may be referred to as a precharge state in the sense amplifier-based flip-flop of FIG. 3.

In the example embodiments of FIGS. 3 and 4, if the clock signal CLK transitions from the second logic level (e.g., a lower logic level or logic "0") to the first logic level (e.g., a higher logic level or logic "1"), the first and second current passing units 300 and 320 may be turned on, thereby passing current of third node N13 and fourth node N14 to the ground terminal. At this time, as described above, an amount of delay of output signal CLK1 (t12) of the first clock signal slope controller 305 and output signal CLK2 (t13) of the second clock signal slope controller 325 may be different, with the delay amount t12 for CLK1 being smaller than the delay amount t13 for CLK2, such that turn-on time points of the first and second current passing units 300 and 320 may be different. Further, if a logic level of the first input signal D is higher than that of a second input signal /D, third NMOS transistor NM103 may be turned on to a higher degree than fourth NMOS transistor NM104, thereby increasing an operation speed of the first latch 100.

In the example embodiment of FIGS. 3 and 4, if first and second clock signal slope controllers 305 and 325 are not included therein, then, similar to the conventional art, turn-on time points of the first and second current passing units 300 and 320 may be substantially the same, and sense and amplification operations may be slower and an input sensitivity may be lower.

In the example embodiment of FIG. 4, t1 may indicate a delay time in a conventional sense amplifier-based flip-flop and t11 may indicate a delay time in a sense amplifier-based flip-flop according to an example embodiment of the present invention. The delay time may indicate a time from a transition time of clock signal CLK to an output time of an evaluation signal corresponding to an input signal pair D, /D. Although the delay time may indicate a time of from a transition time of the clock signal CLK to an output time of evaluation signal corresponding to input signal pair D, /D to a final output terminal Q, /Q, for convenience, the delay time will hereinafter refer to a time at output terminal N11, N12 of the first latch 100 to an output time.

Figure 5:
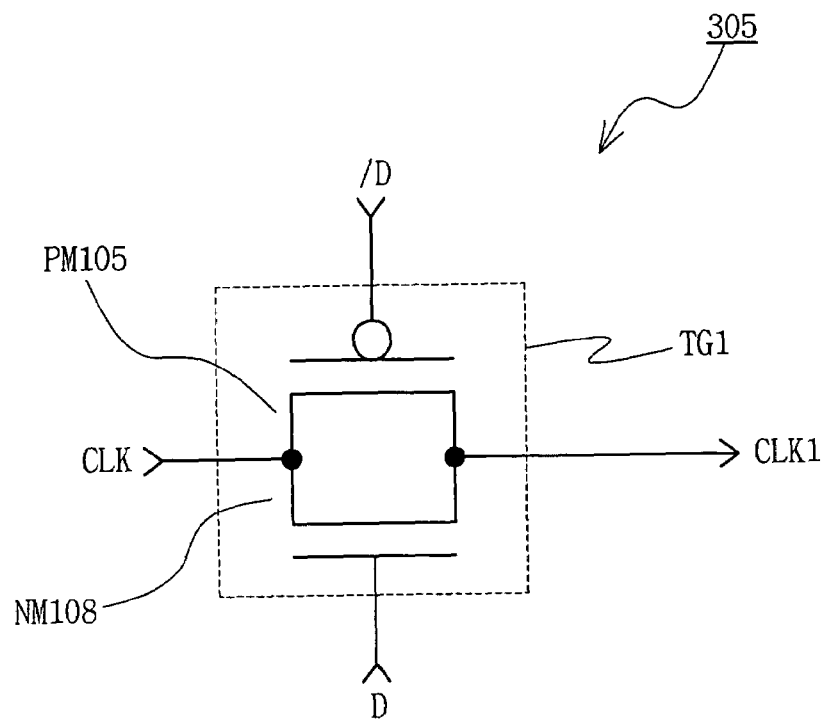
FIG. 5 is a circuit diagram illustrating a first clock signal slope controller of FIG. 3 according to another example embodiment of the present invention.

FIG. 5 is a circuit diagram illustrating the first clock signal slope controller 305 of FIG. 3 according to another example embodiment of the present invention.

Figure 6:
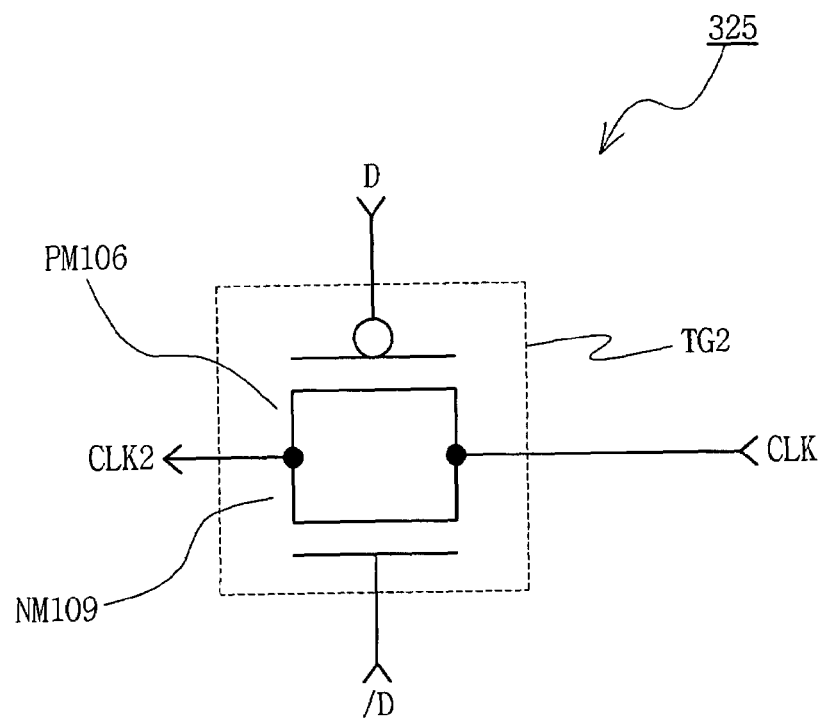
FIG. 6 is a circuit diagram illustrating a second clock signal slope controller of FIG. 3 according to another example embodiment of the present invention.

FIG. 6 is a circuit diagram illustrating the second clock signal slope controller 325 of FIG. 3 according to another example embodiment of the present invention.

In the example embodiment of FIG. 5, the first clock signal slope controller 305 may include a first transmission gate TG1. The first transmission gate TG1 may include an eighth NMOS transistor NM108 controlled by first input signal D, and a fifth PMOS transistor PM105 controlled by second input signal /D. The first clock signal slope controller 305 may have different turn-on levels based on levels of the first input signal D and the second input signal /D. In other words, with respect to RC delay, the first clock signal slope controller 305 may provide a resistance component, and a sixth NMOS transistor NM106 corresponding to the first current passing unit 300 may provide a capacitance component, thus an output signal CLK1 may have a given RC delay. In an example, the eighth NMOS transistor NM108 and the fifth PMOS transistor PM105 corresponding to the first transmission gate TG1 may have a lower threshold voltage.

In the example embodiment of FIG. 6, the second clock signal slope controller 325 may include a second transmission gate TG2. The second transmission gate TG2 may include a ninth NMOS transistor NM109 controlled by second input signal /D, and a sixth PMOS transistor PM106 controlled by first input signal D. Further, the second clock signal slope controller 325 may have turn-on levels which may be different and may be based on levels of the first input signal D and the second input signal /D. With respect to RC delay, the second clock signal slope controller 325 may provide a resistance component, and a seventh NMOS transistor NM107 corresponding to the second current passing unit 320 may provide a capacitance component, thus an output signal CLK2 may have a given RC delay. The ninth NMOS transistor NM109 and the sixth PMOS transistor PM106 corresponding to the second transmission gate TG2 may have a lower threshold voltage.

In the example embodiments of FIGS. 5 and 6, if a level of the first input signal D is higher than a level of the second input signal /D, the resistance component of the first clock signal slope controller 305 may be smaller than that of the second clock signal slope controller 325. Thus, if sizes of the sixth NMOS transistor NM106 and the seventh NMOS transistor NM107 are the same, the RC delay may be lower in the first clock signal slope controller 305, which can be shown, for example, in FIG. 4, by comparing t12 of the output signal CLK1 with t13 of the output signal CLK2.

In the example embodiments of FIGS. 5 and 6, in another example, if a level of the first input signal D is lower than a level of the second input signal /D, the resistance component of the second clock signal slope controller 325 may be smaller than that of the first clock signal slope controller 305. Thus, the RC delay may be lower than the second clock signal slope controller 325, as can be shown, for example, in FIG. 4, by comparing t22 of output signal CLK1 with t23 of output signal CLK2.

In the example embodiment of FIGS. 5 and 6, an output delay time from the clock signal CLK to final output Q, /Q may be reduced, and the respective delay amounts of the first and second clock signal slope controllers 305 and 325 may be different from each other, thereby improving an input sensitivity. For example, in the conventional art, the input sensitivity may be lowered by a current of a third node (e.g., N13 of FIG. 3) and a fourth node (e.g., N14 of FIG. 3) flowing to the ground terminal at the same time. Thus, if a level difference in the input signal pair is relatively small, an operating error may be generated more frequently. In contrast, in a sense amplifier-based flip-flop according to an example embodiment of the invention, the input sensitivity may be improved by obtaining different amounts of delay at the respective clock signal slope controllers 305 and 325. Accordingly, in the example embodiment of FIGS. 5 and 6, an output delay time from clock signal CLK to a final output Q, /Q may be reduced and an input sensitivity may be improved.

Figure 7:
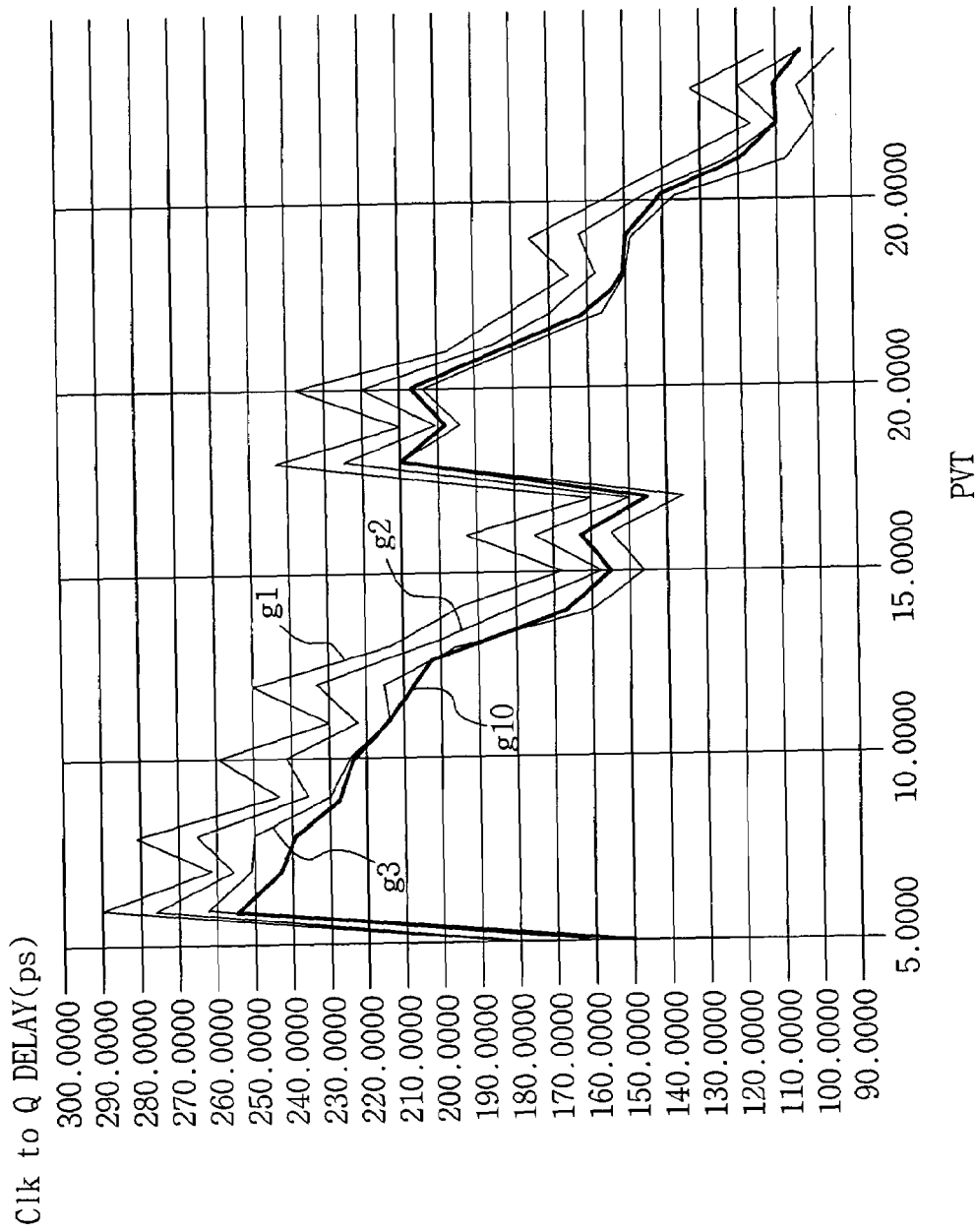
FIG. 7 is a graph illustrating output delay times according to another example embodiment of the present invention.

FIG. 7 is a graph illustrating output delay times according to another example embodiment of the present invention.

FIG. 8 is a graph illustrating error rates based on input signal levels according to another example embodiment of the present invention.

In the example embodiment of FIG. 7, g1, g2 and g3 may denote graphs for output delay time from the clock signal CLK to a final output Q, /Q in the conventional art (e.g., see conventional FIG. 1) and g10 may denote a graph for an output delay time from the clock signal CLK to the final output Q, /Q according to an example embodiment of the present invention. In FIG. 7, the X axis may indicate a PVT variation, and the Y axis may indicate, in unit of pico seconds (ps), an output delay time (e.g., from the clock signal CLK to Q delay) from the clock signal CLK to the final output Q, Q'.

In the example embodiment of FIG. 7, a difference in the conventional graphs g1, g2 and g3 may be based on a driving capability of an NMOS transistor of the current passing unit (e.g., 30, 32 of FIG. 1). If g1 is positioned nearer to g3, the driving capability of the NMOS transistor may be higher. For example, g3 may be indicative of the output delay time if the current passing unit (e.g., 30 of FIG. 1) includes only an NMOS transistor NM11. In another example, g2 may be indicative of the output delay time if the current passing unit (e.g., 30 of FIG. 1) includes NMOS transistors NM11 and NM12. In another example, g1 may be indicative of the output delay time if the current passing unit (e.g., 30 of FIG. 1) includes NMOS transistors NM11, NM12 and NM13.

In the example embodiment of FIG. 7, a period may occur where an output delay time (e.g., Clk to Q delay) is longer than in the conventional art. However, as shown in FIG. 7, in most conditions the output delay time (e.g., Clk to Q delay) of graph g10 may be shorter than the conventional graphs g1, g2 and/or g3, which may indicate an improved performance for a sense amplifier-based flip-flop.

In the example embodiment of FIG. 8, g4, g5 and g6 may denote error rate graphs based on input signals for the conventional art (e.g., see conventional FIG. 1) and g20 may denote an error rate based on an input signal according to an example embodiment of the present invention. As shown in the example embodiment of FIG. 8, the error rate in graph g20 may generally be lower than the error rates in any of conventional graphs g4, g5 and/or g6. Accordingly, a sense amplifier-based flip flop according to example embodiments of the present invention may reduce error rates as compared to the conventional art, thereby improving an input sensitivity.

In the example embodiment of FIG. 8, differences between conventional graphs g4, g5 and g6 may be based on a driving capability of NMOS transistor of the current passing unit (e.g., 30, 32 of FIG. 1), similar to that of conventional graphs g1, g2 and g3 in FIG. 7.

Returning again to the example embodiment of FIG. 3, the first latch 100 may be a current sensing type sense amplifier. The sense amplifier circuit of FIG. 3, which may operate in response to the clock signal CLK, may sense and amplify an input signal pair D, /D if the clock signal CLK is set to the first logic level (e.g., a higher logic level or logic "1"), and may generate a corresponding output signal pair. The sense amplifier of FIG. 3 may include one pair of precharge enable unit PM101, PM103, a latch unit PM102, NM101, PM104, NM102, a data input transistor pair NM103, NM104, first to third current passing unit NM106, NM107, NM105 and first and second clock signal slope controllers 305 and 325.

In the example embodiment of FIG. 3, in the precharge enable unit PM101, PM103, one precharge enable unit may be disposed between power terminal VDD and first node N11, and another precharge enable unit may be disposed between the power terminal and second node N12. The pair of precharge enable units PM101, PM103 may enable the first node N11 and the second node N12 to be precharged to the first logic level (e.g., a higher logic level or logic "1") if the clock signal CLK is set to the second logic level (e.g., a lower logic level or logic "0").

In the example embodiment of FIG. 3, the latch unit PM102, NM101, PM104, NM102 may be connected between the first node N11 and the second node N12, and may latch an output signal pair corresponding to the input signal pair D, /D if the clock signal CLK is set to the first logic level (e.g., a higher logic level or logic "1"). The latch unit PM102, NM101, PM104, NM102 may include a first inverter PM102, NM101 having the first node N11 as an output terminal and the second node N12 as an input terminal, and a second inverter PM104, NM102 having the first node N11 as an input terminal and the second node N12 as an output terminal. The latch unit PM102, NM101, PM104, NM102 may include first node N11 that may be precharged to the first logic level (e.g., a higher logic level or logic "1") if the clock signal CLK is set to the second logic level (e.g., a lower logic level or logic "0") and may provide a first evaluation signal if the clock signal CLK is set to the first logic level. The latch unit PM102, NM101, PM104, NM102 may also include a second node N12 that is set to the first logic level if the clock signal CLK is set to the second logic level and provides a second evaluation signal if the clock signal CLK is set to the second logic level. The first and second evaluation signals may herein be referred to as an output signal pair corresponding to the input signal pair D, /D.

In the example embodiment of FIG. 3, the data input transistor pair NM103, NM104 may be coupled to a current passing node pair N13, N14 of the latch unit PM102, NM101, PM104, NM102, and may receive the input signal pair D, /D. The first and second current passing units 300 and 320 may be connected between the current passing node pair N13, N14 of the latch unit PM102, NM101, PM104, NM102, and a ground terminal. The first current passing unit 300 may include an NMOS transistor NM106 controlled by an output signal CLK1 of the first clock signal slope controller 305, and the second current passing unit 320 may include an NMOS transistor NM107 controlled by an output signal CLK2 of the second clock signal slope controller 325. The first and second current passing units may be turned on if the clock signal CLK transitions from the second logic level to the first logic level, thereby passing current of the current passing node pair N13, N14 to the ground terminal.

In the example embodiment of FIG. 3, the third current passing unit NM105 may be disposed between a common source terminal N15 of the data input transistor pair NM103, NM104 and a ground terminal, and may be controlled by the clock signal CLK to pass current of the common source terminal N15 to the ground terminal. For example, the third current passing unit NM105 may be an NMOS transistor NM105 turned on if the clock signal CLK is set to the first logic level (e.g., a higher logic level or logic "1") and turned off if the clock signal CLK is set to the second logic level (e.g., a lower logic level or logic "0").

In the example embodiment of FIG. 3, the first clock signal slope controller 305 may include a first transmission gate TG1. The first transmission gate TG1 may include an NMOS transistor NM108 receiving first input signal D as one of the input signal pair D, /D through a gate terminal, and a PMOS transistor PM105 receiving second input signal /D as another of the input signal pair D, /D through a gate terminal.

In the example embodiment of FIG. 3, the first clock signal slope controller 305 may enable the clock signal CLK to have a given delay. That is, the clock signal CLK2 applied to the first current passing unit 300 may be a delayed version of the clock signal CLK (e.g., an "initial" clock signal).

In the example embodiment of FIG. 3, the second clock signal slope controller 325 may include a second transmission gate TG2. The second transmission gate TG2 may include an NMOS transistor NM109 receiving second input signal /D as one of the input signal pair D, /D through a gate terminal, and a PMOS transistor PM106 receiving first input signal D as another of the input signal pair D, /D through a gate terminal.

In the example embodiment of FIG. 3, the second clock signal slope controller 325 may enable the clock signal CLK with a given delay amount different from a delay amount provided between the signal CLK2 and the clock signal CLK (e.g., an "initial" clock signal).

In another example embodiment of the present invention, a sense amplifier circuit may have an output delay time (e.g., Clk to Q delay) which may be shorter than an output delay time of a conventional sense amplifier circuit. Accordingly, a performance of the example sense amplifier circuit may be improved and an error rate may be reduced, as described above with respect to FIGS. 7 and 8.

A process of reducing an output delay time until a final output signal of a sense amplifier-based flip-flop is output will now be described with reference to FIGS. 3 to 8, according to another example embodiment of the present invention.

In the example process of reducing an output delay time, with reference to FIGS. 3 through 8, a sense amplifier-based flip-flop that operates in response to a clock signal CLK may be provided. The sense amplifier based flip-flop may include a sense amplifier unit 100 and an RS latch 200. The output delay time may be a time period from a transition of the clock signal CLK from the second logic level (e.g., a lower logic level or logic "0") to the first logic level (e.g., a higher logic level or logic "1") until an output of a "final" output signal Q, Q'. Different amounts of delay may be inserted into the clock signals CLK applied to first and second current passing units 300 and 320, respectively. The first and second current passing units 300 and 320 may pass currents from two nodes N13 and N14, positioned between a latch unit PM102, NM101, PM103, NM102 of the sense amplifier unit 100 and a data input transistor pair NM103, NM104, to a ground terminal. In an example, the different induced amounts of delay within the clock signals at the first and second current passing units 300 and 320 may be based on an input data pair.

In another example embodiment of the present invention, current passing units within a sense amplifier-based flip flop may pass current in response to clock signals delayed from an initial or default clock signal by different amounts. Thus, one of the current passing units may drive current to a ground terminal more quickly then the other, which may increase a speed of a sensing operation to improve the performance of the sense amplifier-based flip flop.

Example embodiments of the present invention being thus described, it will be obvious that the same may be varied in many ways. For example, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A sense amplifier-based flip-flop, comprising:
   a first current passing unit receiving a first clock signal with a first delay, the first current passing unit configured to pass current from a first node to a ground terminal if the applied first clock signal is set to a first logic level and not to pass current from the first node to the ground terminal if the applied first clock signal is set to a second logic level;
   a second current passing unit receiving a second clock signal with a second delay, the second delay and the first delay not being the same, the second current passing unit configured to pass current from a second node to the ground terminal if the applied second clock signal is set to the first logic level and not to pass current from the second node to the ground terminal if the applied second clock signal is set to the second logic level;
   a first latch configured to output the first logic level to a first output terminal if an initial clock signal is set to the second logic level and to output an evaluation signal pair corresponding to an input signal pair to the first output terminal if the initial clock signal is set to the first logic level;
   a second latch configured to latch the evaluation signal pair output from the first output terminal and to transfer the latched evaluation signal pair to a second output terminal; and
   first and second clock signal slope controllers for generating the first and second clock signals having the first and second delays, respectively;
   wherein the first and second current passing units are connected between a current passing node pair of the first latch and the ground terminal, and the first and second current passing units are turned on if the first and second clock signals, respectively, transition from the second logic level to the first logic level so as to pass currents from the first and second nodes, respectively, to the ground terminal.

2. The sense amplifier-based flip flop of claim 1, wherein the first logic level is a higher logic level and the second logic level is a lower logic level.

3. The sense amplifier-based flip flop of claim 1, wherein the first latch includes:
   a third node set to the first logic level if the initial clock signal is set to the second logic level and set to a first evaluation signal if the initial clock signal is set to the first logic level, and
   a fourth node set to the first logic level if the initial clock signal is set to the second logic level and set to a second evaluation signal if the initial clock signal is set to the first logic level,
   wherein the third and fourth nodes correspond to the first output terminal and the first and second evaluation signals correspond to the evaluation signal pair.

4. The sense amplifier-based flip flop of claim 3, wherein the first latch includes:
   a first PMOS transistor disposed between a power terminal and the third node and turned on or off in response to the initial clock signal;
   a second PMOS transistor disposed between the power terminal and the third node, a gate terminal of the second PMOS transistor being connected to the fourth node;
   a first NMOS transistor disposed between the third node and the first node, a gate terminal of the first NMOS transistor being connected to the fourth node;
   a third PMOS transistor disposed between the power terminal and the fourth node, and turned on or off in response to the initial clock signal;
   a fourth PMOS transistor disposed between the power terminal and the fourth node, a gate terminal of the fourth PMOS transistor being connected to the third node;
   a second NMOS transistor disposed between the fourth node and the second node, a gate terminal of the second NMOS transistor being connected to the third node;
   a third NMOS transistor disposed between the first node and a fifth node, and controlled by a first input signal as one of the input signal pair;
   a fourth NMOS transistor disposed between the second node and the fifth node, and controlled by a second input signal as another of the input signal pair; and
   a fifth NMOS transistor disposed between the fifth node and the ground terminal, and turned on or off in response to the initial clock signal.

5. The sense amplifier-based flip flop of claim 4, wherein the first and second nodes correspond to the current passing node pair of the first latch.

6. The sense amplifier-based flip flop of claim 4, wherein the first current passing unit includes a sixth NMOS transistor controlled by an output signal of the first clock signal slope controller.

7. The sense amplifier-based flip flop of claim 4, wherein the second current passing unit includes a sixth NMOS transistor controlled by an output signal of the second clock signal slope controller.

8. The sense amplifier-based flip flop of claim 4, wherein the first clock signal slope controller includes a transmission gate in which a sixth NMOS transistor is controlled by the first input signal and a fifth PMOS transistor is controlled by the second input signal.

9. The sense amplifier-based flip flop of claim 4, wherein the second clock signal slope controller includes a transmission gate in which a sixth NMOS transistor is controlled by the second input signal and a fifth PMOS transistor is controlled by the first input signal.

10. The sense amplifier-based flip flop, comprising:
   a first current passing unit receiving a first clock signal with a first delay, the first current passing unit configured to pass current from a first node to a ground terminal if the applied first clock signal is set to a first logic level and not to pass current from the first node to the ground terminal if the applied first clock signal is set to a second logic level;
   a second current passing unit receiving a second clock signal with a second delay, the second delay and the first delay not being the same, the second current passing unit configured to pass current from a second node to the ground terminal if the applied second clock signal is set to the first logic level and not to pass current from the second node to the around terminal if the applied second clock signal is set to the second logic level;
   a pair of precharge enable units, a first of the precharge enable units being disposed between a power terminal and a third node, and a second of the precharge enable units being disposed between the power terminal and a fourth node, the third and fourth nodes being precharged to the first logic level if an initial clock signal is set to the second logic level;
   a latch unit connected between the third node and the fourth node, for latching an output signal pair corresponding to an input signal pair if the initial clock signal is set to the first logic level;
   a data input transistor pair connected to a current passing node pair of the latch unit, for receiving the input signal pair;
   a third current passing unit disposed between a common source terminal of the data input transistor pair and the ground terminal, and controlled by the initial clock signal to pass current of the common source terminal to the ground terminal; and
   first and second clock signal slope controllers for generating the first and second clock signals having the first and second delays, respectively.

11. The sense amplifier-based flip flop of claim 10, wherein the latch unit includes:
   a first inverter having the third node as an output terminal and the fourth node as an input terminal, and a second inverter having the third node as an input terminal and the fourth node as an output terminal.

12. The sense amplifier-based flip flop of claim 11, wherein the latch unit includes the third and fourth nodes such that
   the third node is set to the first logic level if the initial clock signal is set to the second logic level and set to a first evaluation signal if the initial clock signal is set to the first logic level, and
   the fourth node is set to the first logic level if the initial clock signal is set to the second logic level and set to a second evaluation signal if the initial clock signal is set to the first logic level,
   wherein the first and second evaluation signals correspond to the evaluation signal pair.

13. The sense amplifier-based flip flop of claim 10, wherein the first current passing unit includes:
   an NMOS transistor controlled by an output signal of the first clock signal slope controller.

14. The sense amplifier-based flip flop of claim 10, wherein the second current passing unit includes an NMOS transistor controlled by an output signal of the second clock signal slope controller.

15. The sense amplifier-based flip flop of claim 10, wherein the third current passing unit is an NMOS transistor turned on if the initial clock signal is set to the first logic level and turned off if the initial clock signal is set to the second logic level.

16. The sense amplifier-based flip flop of claim 10, wherein the first clock signal slope controller includes:
   a transmission gate including an NMOS transistor controlled by a first input signal as one of the input signal pair, and a PMOS transistor controlled by a second input signal as another of the input signal pair.

17. The sense amplifier-based flip flop of claim 10, wherein the second clock signal slope controller includes:
   a transmission gate including a PMOS transistor controlled by a first input signal as one of the input signal pair, and an NMOS transistor controlled by a second input signal as another of the input signal pair.

* * * * *